United States Patent
Son et al.

(10) Patent No.: US 10,696,081 B2
(45) Date of Patent: Jun. 30, 2020

(54) METHOD FOR MANUFACTURING CLICHÉ FOR OFFSET PRINTING, AND CLICHÉ FOR OFFSET PRINTING

(71) Applicant: LG CHEM, LTD., Seoul (KR)

(72) Inventors: Yong Goo Son, Daejeon (KR); Seung Heon Lee, Daejeon (KR)

(73) Assignee: LG CHEM, LTD., Seoul (KR)

( * ) Notice: Subject to any disclaimer, the term of this patent is extended or adjusted under 35 U.S.C. 154(b) by 219 days.

(21) Appl. No.: 15/536,046

(22) PCT Filed: Aug. 26, 2016

(86) PCT No.: PCT/KR2016/009529
§ 371 (c)(1),
(2) Date: Jun. 14, 2017

(87) PCT Pub. No.: WO2017/034372
PCT Pub. Date: Mar. 2, 2017

(65) Prior Publication Data
US 2017/0368862 A1 Dec. 28, 2017

(30) Foreign Application Priority Data
Aug. 26, 2015 (KR) .................. 10-2015-0120159

(51) Int. Cl.
| | | |
|---|---|---|
| H01L 21/027 | (2006.01) | |
| B41N 1/06 | (2006.01) | |
| H01L 21/67 | (2006.01) | |
| H01L 21/033 | (2006.01) | |
| H01L 21/02 | (2006.01) | |
| H01L 21/768 | (2006.01) | |
| G03F 7/20 | (2006.01) | |
| B41C 1/00 | (2006.01) | |
| G03F 7/038 | (2006.01) | |
| G03F 7/32 | (2006.01) | |
| G03F 7/40 | (2006.01) | |

(52) U.S. Cl.
CPC ............. B41N 1/06 (2013.01); B41C 1/00 (2013.01); G03F 7/0385 (2013.01); G03F 7/2004 (2013.01); G03F 7/2022 (2013.01); G03F 7/325 (2013.01); H01L 21/02 (2013.01); H01L 21/027 (2013.01); H01L 21/033 (2013.01); H01L 21/67 (2013.01); H01L 21/768 (2013.01); G03F 7/40 (2013.01)

(58) Field of Classification Search
None
See application file for complete search history.

(56) References Cited

U.S. PATENT DOCUMENTS 5,494,780 A    2/1996  Nakashima et al.
6,030,732 A *  2/2000  Liu .................... H01L 21/0274
                                        257/E21.027

(Continued)

FOREIGN PATENT DOCUMENTS

| CN | 101301827 | 11/2008 |
| CN | 102099741 | 6/2011 |

(Continued)

*Primary Examiner* — Jill E Culler
(74) *Attorney, Agent, or Firm* — Dentons US LLP

(57) ABSTRACT

The present invention relates to a method for manufacturing a cliché for offset printing and a cliché for offset printing.

2 Claims, 10 Drawing Sheets

(56) References Cited

U.S. PATENT DOCUMENTS

| | | | |
|---|---|---|---|
| 6,242,156 B1 * | 6/2001 | Teng | B41C 1/1033 101/454 |
| 6,811,858 B1 * | 11/2004 | Mayer | B41M 1/10 101/401.1 |
| 2003/0122896 A1 | 7/2003 | Jeong et al. | |
| 2004/0007145 A1 * | 1/2004 | Franz | B41C 1/04 101/401.1 |
| 2004/0090170 A1 | 5/2004 | Cha et al. | |
| 2005/0028691 A1 * | 2/2005 | Baek | B41F 17/001 101/41 |
| 2007/0056456 A1 * | 3/2007 | Kwon | B41C 1/02 101/401.1 |
| 2008/0236425 A1 | 10/2008 | Takamatsu | |
| 2009/0123872 A1 | 5/2009 | Deutsch et al. | |
| 2009/0173245 A1 * | 7/2009 | Irisawa | B41C 1/14 101/128.21 |
| 2010/0032678 A1 | 2/2010 | Kim et al. | |
| 2010/0136301 A1 | 6/2010 | Kim et al. | |
| 2010/0213174 A1 | 8/2010 | Shin | |
| 2011/0123927 A1 | 5/2011 | Park et al. | |
| 2012/0125213 A1 * | 5/2012 | Koo | B41N 1/06 101/395 |
| 2013/0034657 A1 | 2/2013 | Kim et al. | |
| 2013/0239831 A1 | 9/2013 | Lee et al. | |
| 2013/0344300 A1 * | 12/2013 | Hwang | B41C 1/02 428/195.1 |
| 2015/0125789 A1 | 5/2015 | Park et al. | |
| 2016/0271992 A1 | 9/2016 | Koo et al. | |

FOREIGN PATENT DOCUMENTS

| | | |
|---|---|---|
| CN | 103314428 | 9/2013 |
| CN | 104335120 | 2/2015 |
| CN | 104837638 | 8/2015 |
| KR | 20030058162 A | 7/2003 |
| KR | 20040040049 A | 5/2004 |
| KR | 20080090890 A | 10/2008 |
| KR | 20090033813 A | 4/2009 |
| KR | 10-1226914 | 1/2013 |
| KR | 20130015569 A | 2/2013 |
| KR | 10-1403870 | 6/2014 |

* cited by examiner

[Figure 1]
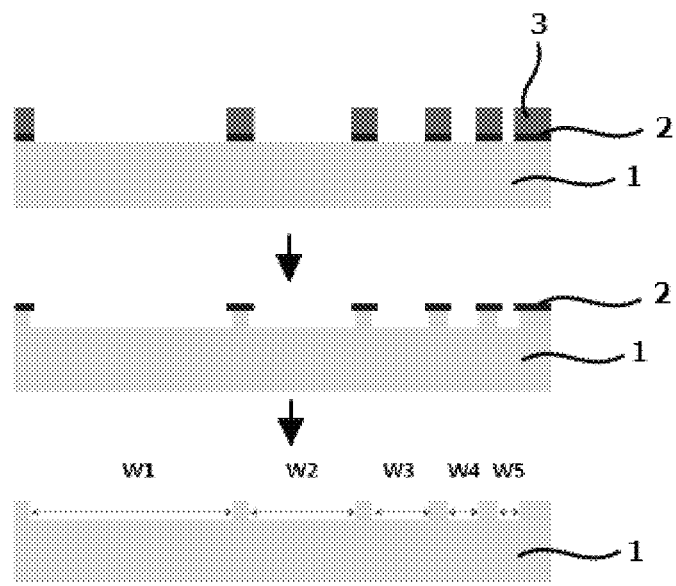
[Figure 2]
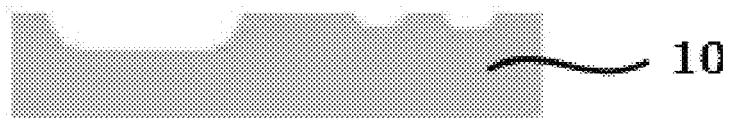

[Figure 3]
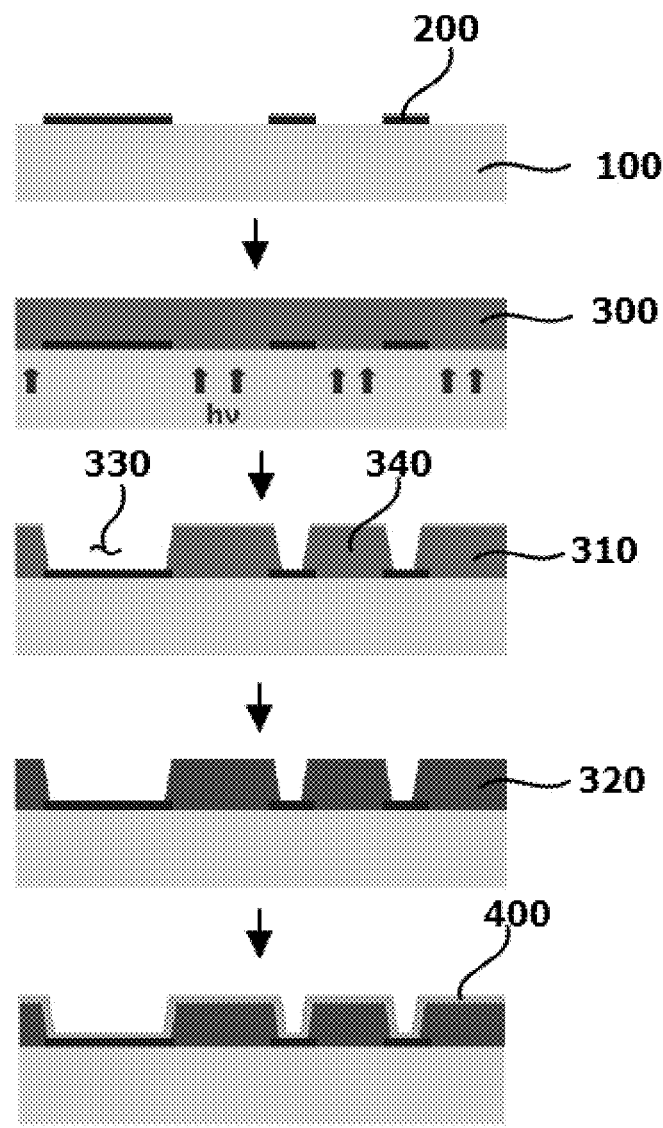
[Figure 4]
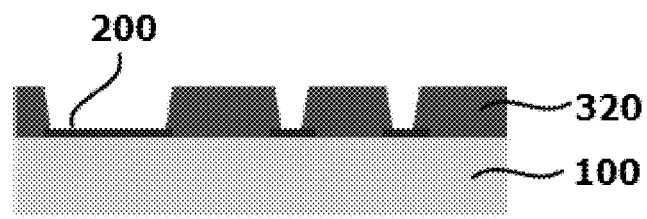

[Figure 5]
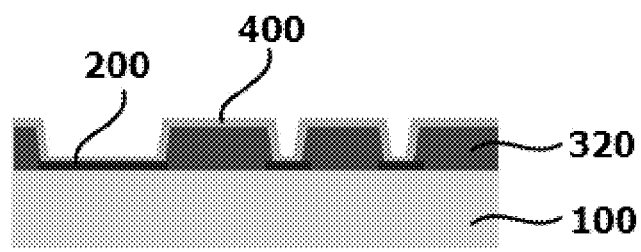

[Figure 6]
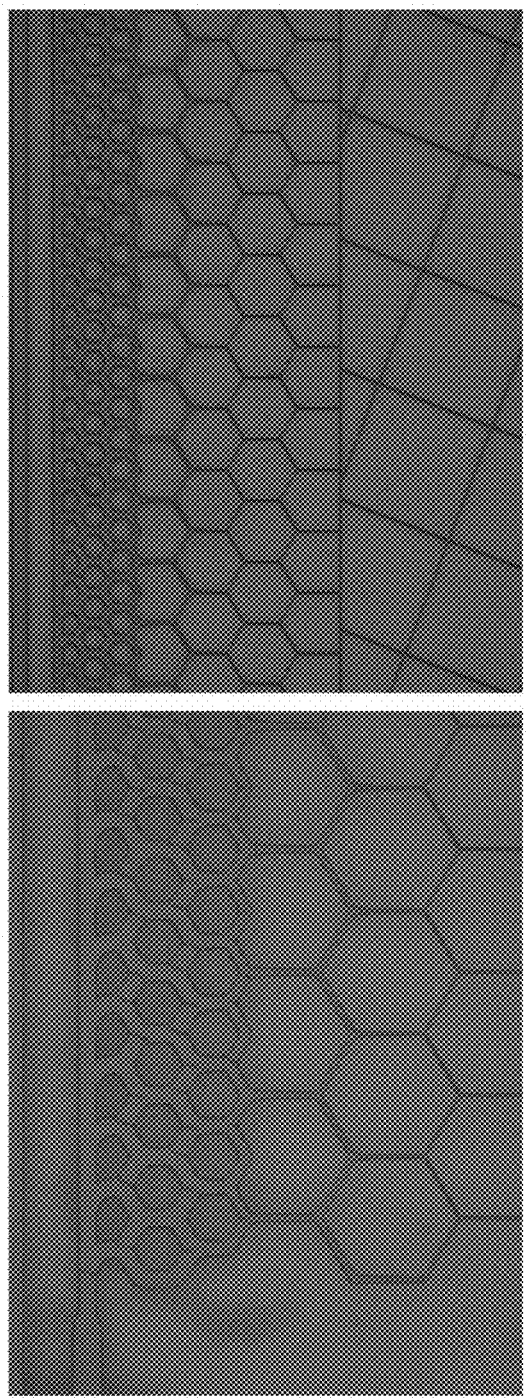

[Figure 7]
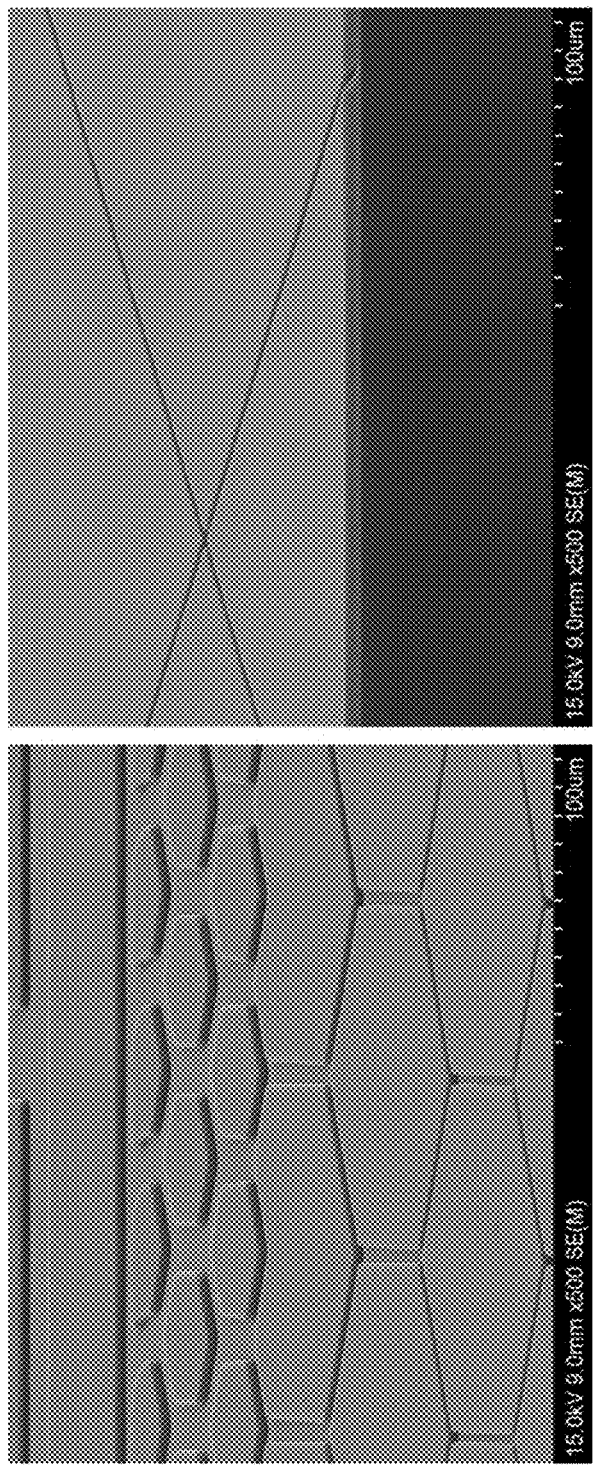

[Figure 8]
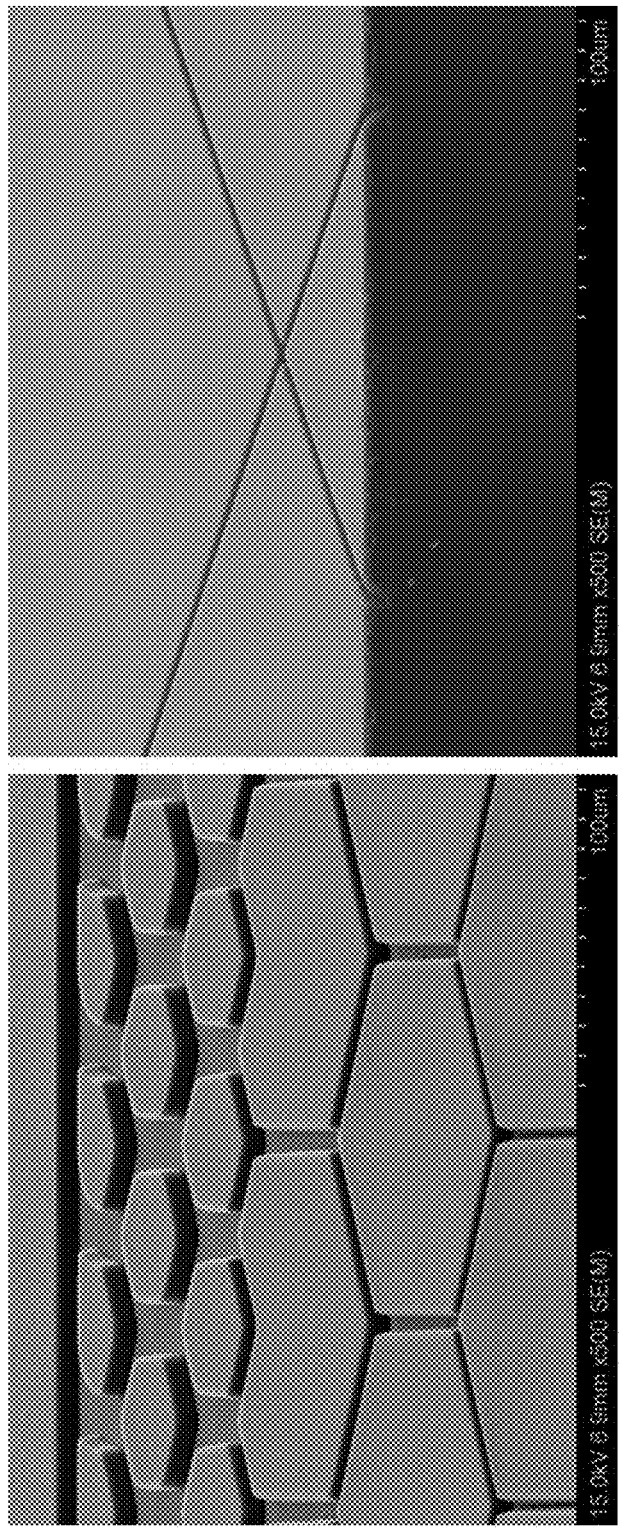

[Figure 9]
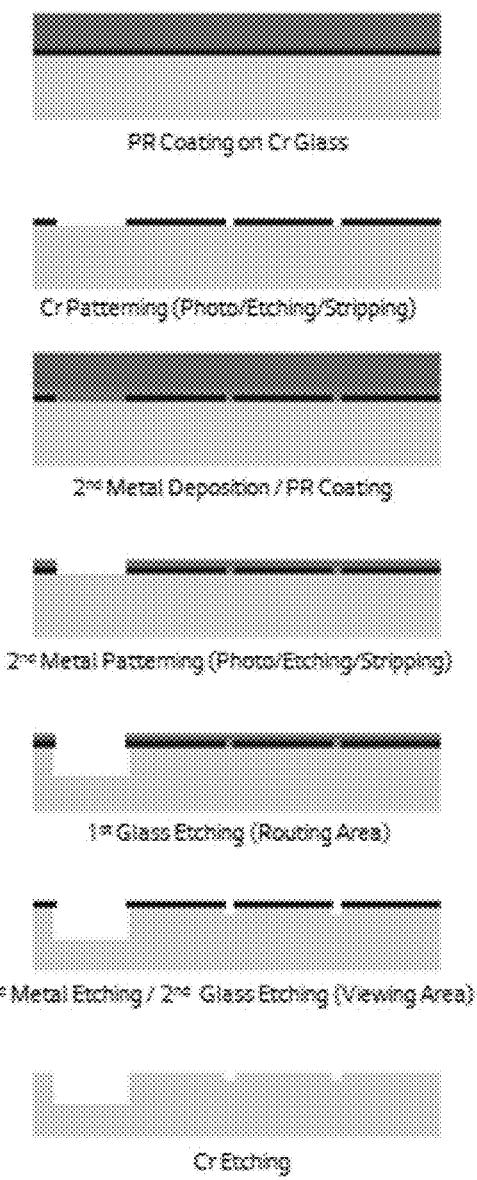

[Figure 10]
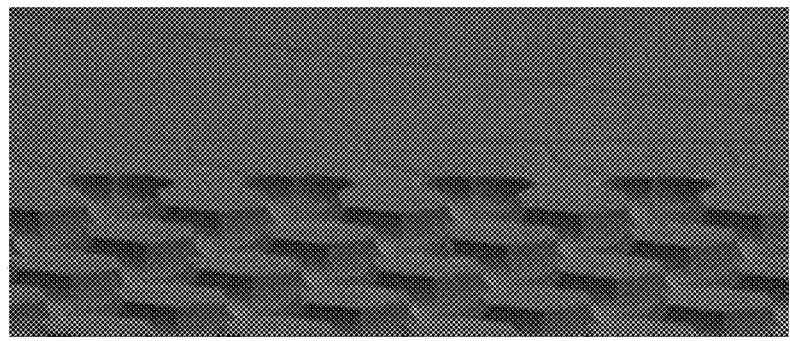
[Figure 11]
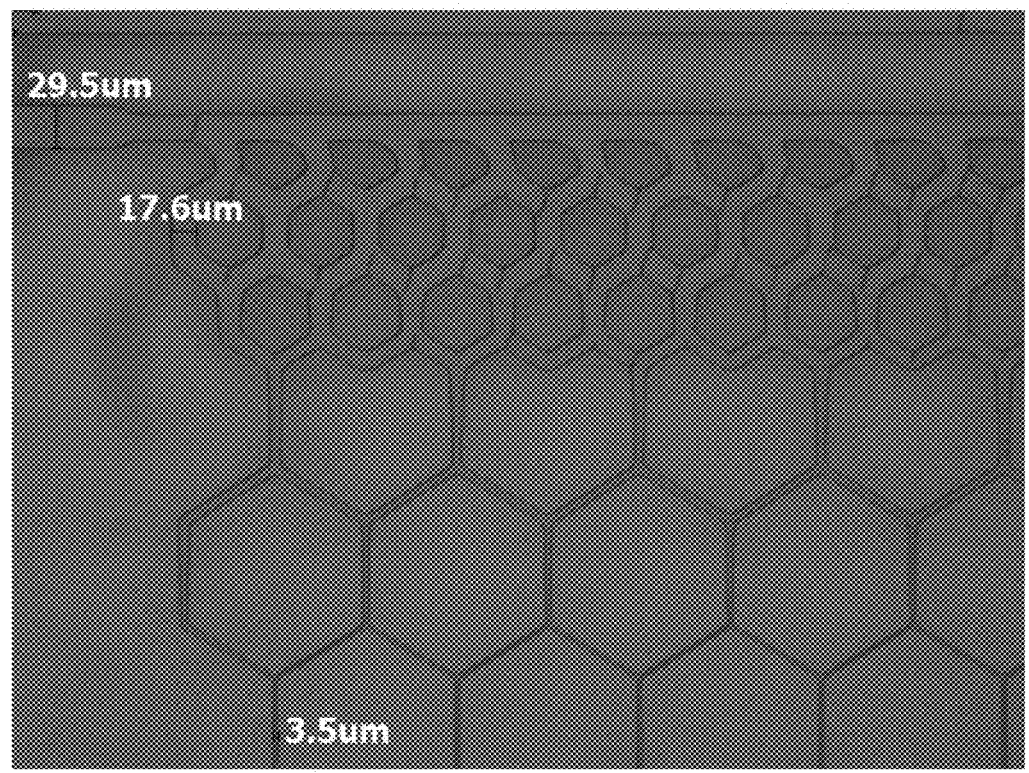

[Figure 12]
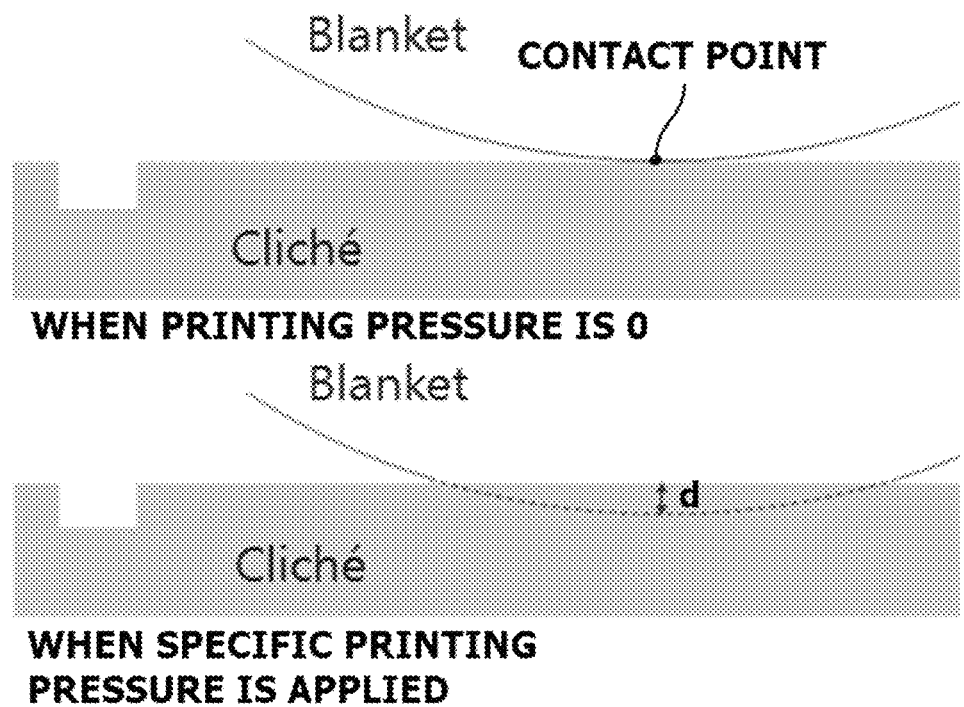

[Figure 13]
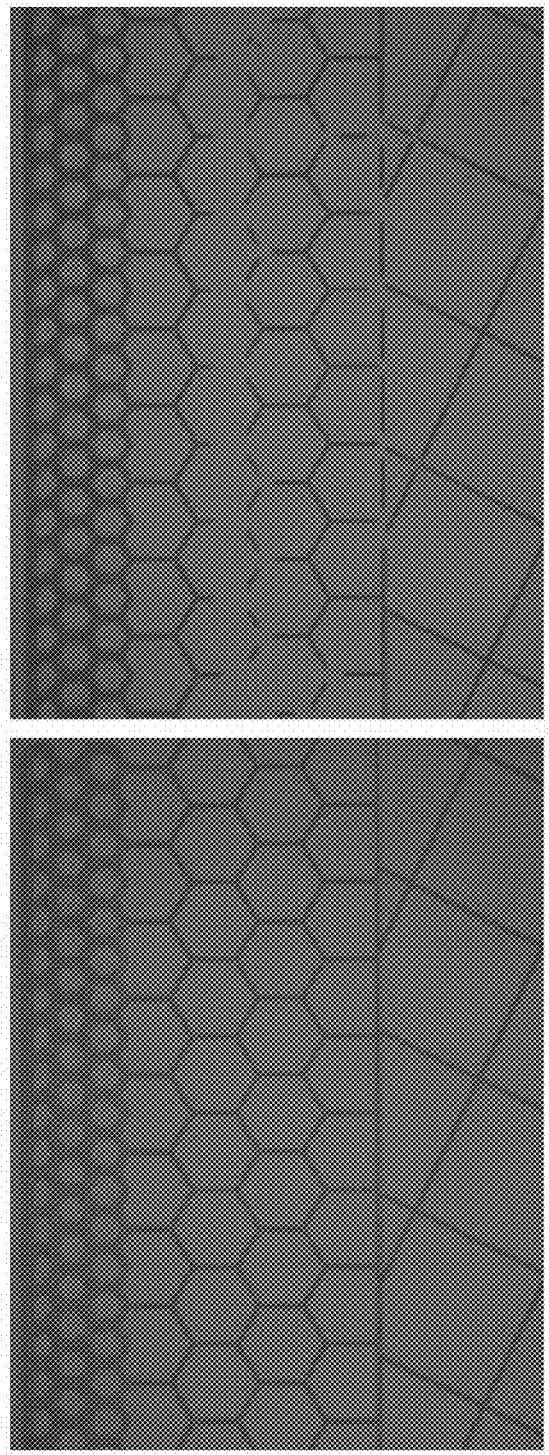

METHOD FOR MANUFACTURING CLICHÉ FOR OFFSET PRINTING, AND CLICHÉ FOR OFFSET PRINTING

TECHNICAL FIELD

This application is a National Stage Application of International Application No. PCT/KR2016/009529, filed Aug. 26, 2016, and claims the benefit of Korean Patent Application No. 10-2015-0120159, filed Aug. 26, 2015, contents of which are incorporated herein by reference in their entirety for all purposes as if fully set forth below.

The present invention relates to a method for manufacturing a cliché for offset printing and a cliché for offset printing.

BACKGROUND ART

In general, electronic devices such as a liquid crystal display and a semiconductor device are manufactured by forming patterns of many layers on a substrate. In order to form the patterns, until now, a photolithography process has been frequently used. However, the photolithography process has a problem in that the manufacturing process is complicated and a large amount of chemical waste hazardous to the environment is generated because a predetermined pattern mask needs to be manufactured and a process of chemical etching and stripping needs to be repeated. Due to the problems, the manufacturing costs are increased and thus the competitiveness of products deteriorates. As a new method of forming patterns for solving the disadvantages of the photolithography process, a roll printing method using a printing roll is proposed.

The roll printing method comprises various methods, but may be largely divided into two types of a gravure printing method and a reverse offset printing method.

The gravure printing method is a printing method in which printing is performed by smearing ink on a concave plate and removing the remaining ink and known as a method suitable for printing in various fields such as publishing, packaging, cellophane, vinyl, and polyethylene, and researches for applying the gravure printing method to manufacture active elements or circuit patterns applied to the display devices have been conducted. In the gravure printing method, since the ink is transferred onto the substrate by using a transfer roll, even in a large-area display device, patterns may be formed through one transfer by using a transfer roll corresponding to an area of the desired display device. The gravure printing method may be used for forming an ink pattern for a resist on the substrate and patterning various patterns of the display device, for example, metal patterns for a gate line and a data line which are connected with the TFT, a pixel electrode, and a capacitor as well as a TFT in the case of a liquid crystal display device.

However, generally, a blanket used in the gravure printing method is manufactured by casting a silicon-based resin in a hard master mold, and there is a limit in manufacturing the blanket manufactured above to have a uniform thickness and it is difficult to mass-produce the blanket with a pilot scale. As a result, in order to precisely form fine patterns, the reverse offset printing method is mainly adopted.

DETAILED DESCRIPTION OF THE INVENTION

Technical Problem

An object of the present invention is to provide a method for manufacturing a cliché for offset printing and a cliché for offset printing.

Technical Solution

An exemplary embodiment of the present invention provides a method for manufacturing a cliché for offset printing comprising: forming a light shielding mask pattern on a substrate; forming a negative photoresist layer on the substrate provided with the light shielding mask pattern; exposing the negative photoresist layer by irradiating light to the substrate side; and forming a negative photoresist pattern layer having a protruding embossed portion and a developed groove pattern by developing the exposed negative photoresist layer, in which an average thickness of the negative photoresist layer is 3 μm or more, the negative photoresist pattern layer has at least two groove patterns having different line widths, a difference in line width between at least two groove patterns is 10 μm or more, and at least two groove patterns having a difference in line width of 10 μm or more are connected to each other.

Another exemplary embodiment of the present invention provides a cliché for offset printing comprising: a substrate; a negative photoresist pattern layer provided on the substrate and having an embossed portion and a groove pattern; and a light shielding mask pattern provided on a bottom portion of the groove pattern, in which an average depth of the groove pattern of the negative photoresist is 3 μm or more, the negative photoresist pattern layer comprises at least two groove patterns having different line widths, an average depth of the groove pattern of the negative photoresist pattern layer is the same, a difference in line width between at least two groove patterns is 10 μm or more, and at least two groove patterns having a difference in line width of 10 μm or more are connected to each other.

Advantageous Effects

According to the method for manufacturing the cliché of the present invention, it is possible to reduce costs without requiring a direct laser exposure process having high cost when manufacturing the cliché.

Further, according to the method for manufacturing the cliché of the present invention, it is possible to easily prepare a negative photoresist pattern having a thick film.

Further, according to the method for manufacturing the cliché of the present invention, it is possible to solve a bottom contact problem according to an increase in line width of the pattern by adjusting the thickness of the negative photoresist pattern of the cliché.

BRIEF DESCRIPTION OF DRAWINGS

FIG. 1 illustrates a method for manufacturing a cliché having groove patterns with different line widths in the related art.

FIG. 2 illustrates a method for manufacturing a cliché having groove patterns of which depths are adjusted according to a different line width in the related art.

FIG. 3 illustrates a method of manufacturing a cliché according to an exemplary embodiment of the present invention.

FIG. 4 is a cross-sectional view of the cliché according to the exemplary embodiment of the present invention.

FIG. 5 is a cross-sectional view of a cliché according to another exemplary embodiment of the present invention.

FIG. 6 is an optical microscope image of aluminum patterns formed on a glass substrate in Example 1.

FIG. 7 is an SEM image of the cliché manufactured in Example 1.

FIG. 8 is an SEM image of a cliché manufactured in Example 3.

FIG. 9 illustrates a cliché manufacturing order in Comparative Example.

FIG. 10 is an SEM image of the cliché manufactured in Comparative Example.

FIG. 11 illustrates an optical microscope image showing that the line width of the junction pattern is gradually changed and illustrates measurement of a line width for calculating an average line width of a pattern of a connection part.

FIG. 12 is an image for a printing pressure test.

FIG. 13 is an optical microscope image of patterns printed by using the cliché in Example 1 and the cliché in Comparative Example when printing pressure is 100 μm.

EXPLANATION OF REFERENCE NUMERALS AND SYMBOLS

1: Substrate or cliché
2: Etching pattern
3: Resist pattern
10: Cliché
100: Substrate
200: Light shielding mask pattern
300: Negative photoresist layer
310: Negative photoresist pattern layer
320: Cured negative photoresist pattern layer
330: Groove pattern
340: Embossed portion
400: Metal oxide film

BEST MODE

Hereinafter, exemplary embodiments of the present invention will be described in detail.

The present invention provides a method for manufacturing a cliché for offset printing comprising the steps of: forming a light shielding mask pattern on a substrate; forming a negative photoresist layer on the substrate with the light shielding mask pattern; exposing the negative photoresist layer by irradiating light to the substrate side; and forming a negative photoresist pattern layer having a protruding embossed portion and a developed groove pattern by developing the exposed negative photoresist layer.

The method for manufacturing the cliché for offset printing may comprise a step of forming a light shielding mask pattern on the substrate.

The method of forming the light shielding mask pattern on the substrate is not particularly limited, but may adopt methods which are generally used in the art. For example, the method of forming the light shielding mask pattern on the substrate may comprise roll printing, an inkjet printing method, a screen printing method, a deposition method, a photolithography method, an etching method, and the like.

The forming of the light shielding mask pattern may comprise forming a light shielding film on the substrate using a light shielding material and forming a light shielding mask pattern by etching the light shielding film.

The forming of the light shielding mask pattern may be transferring the light shielding mask pattern onto the substrate by contacting the substrate with a printing plate or a printing roll patterned with a light shielding material.

The forming of the light shielding mask pattern may be patterning the substrate with a light shielding material ink.

The thickness of the light shielding mask pattern is not particularly limited as long as the light shielding mask pattern may block the irradiated light, but for example, an average thickness of the light shielding mask pattern may be 20 nm or more and 500 nm or less.

A material of the light shielding mask pattern is not particularly limited as long as the material may block the irradiated light, but for example, the material of the light shielding mask pattern may be a metal pattern, and particularly, the metal pattern may be made of at least one of copper (Cu), chromium (Cr), aluminum (Al), molybdenum (Mo), nickel (Ni), gold (Au) and silver (Ag).

The line width of the light shielding mask pattern is not particularly limited, but for example, the line width of the light shielding mask pattern may be 2 μm or more and 100 μm or less.

The line width of at least a partial region of the light shielding mask pattern provided on the substrate may be different from the line width of the remaining region. In other words, the light shielding mask pattern may comprise two or more light shielding mask patterns having different line widths.

A difference in line width between two or more kinds of light shielding mask patterns having different line widths may be 10 μm or more.

At least two light shielding mask patterns having a difference in line width of 10 μm or more may be connected to each other.

The shape of the light shielding mask pattern may be a pattern shape of a field requiring a metal pattern or a photoresist pattern.

The shape of the light shielding mask pattern may be a shape of the metal pattern of a touch panel, and the same pattern may be repeated or two or more different patterns may be spaced apart from or connected to each other. For example, the shape of the light-shielding mask pattern may be at least one of a lattice-shaped active pattern, a router pattern connected to the active pattern and connected to an external printed circuit board, and a junction pattern for lowering resistance when connecting the active pattern and the router pattern.

When the light shielding mask pattern comprises all of the active pattern, the router pattern, and the junction pattern, in order to lower the resistance when connecting the active pattern and the router pattern, the line width of the junction pattern may be increased from the active pattern to the router pattern.

As illustrated in FIG. 11, the line width of the junction pattern which connects the active pattern and the router pattern is increased from the active pattern to the router pattern, and in this case, an average line width of the junction pattern is set by measuring at least three line width values having minimum, medium and maximum line widths in the junction pattern and calculating an average value of these values.

Further, the shape of the light shielding mask pattern may further comprise a ground pattern of a circuit of an external printed circuit board and the ground pattern may not be connected with the active pattern, the router pattern, and the junction pattern, but spaced apart from each other.

The method for manufacturing the cliché for offset printing may comprise forming a negative photoresist layer on the substrate with the light shielding mask pattern.

The negative photoresist layer may comprise a polymer that is exposed to light to change resistance to a developer. Specifically, the negative photoresist layer may comprise a polymer in which light is not blocked by the light shielding mask pattern on the substrate, the exposed portion to the light is not developed by the developer, and thus an opposite pattern to the light shielding mask pattern is formed.

An average thickness of the negative photoresist layer may be 3 μm or more. In this case, regardless of the line width of the groove pattern, a groove depth of 3 μm or more is ensured to prevent a bottom contact phenomenon due to the lack of groove depth and a disconnection phenomenon of the junction according to a change of the groove depth.

Particularly, the average thickness of the negative photoresist layer may be 3 μm or more and 15 μm or less, and more particularly, the average thickness of the negative photoresist layer may be 3 μm or more and 10 μm or less.

The forming of the negative photoresist layer may comprise preparing a composition of a negative photoresist; forming a film by applying the composition of the negative photoresist on the substrate provided with the light shielding mask pattern, and forming a negative photoresist layer by drying the film formed of the composition of the negative photoresist.

The composition of the negative photoresist may comprise a photosensitive resin, and may further comprise at least one of a crosslinking agent, an adhesion enhancer, a surfactant, and a solvent.

Kinds of the photosensitive resin, the crosslinking agent, the adhesion enhancer, the surfactant, and the solvent are not particularly limited, and materials which are generally used in the art may be selected.

The method for manufacturing the cliché for offset printing may comprise exposing (hereinafter, referred to as an exposing step) the light shielding mask pattern by irradiating the light to the substrate side.

In the exposure step, the light shielding mask pattern is exposed by irradiating the light to the substrate side, and particularly, the light may be selectively exposed to the negative photoresist layer by the light shielding mask pattern of the substrate by irradiating the light to the light shielding mask pattern of the substrate and the opposite side of the surface provided with the negative photoresist layer.

In the exposing step, by irradiating the light to the light shielding mask pattern of the substrate and the opposite side of the surface provided with the negative photoresist layer, the light passes through only a region where the light shielding mask pattern is not formed to expose a part of the negative photoresist layer formed in the region where the light shielding mask pattern is not formed to the transmitted light.

A part of the negative photoresist layer exposed to the light in the exposing step may be changed to a property which is not developed by the developer.

The exposure conditions may be adjusted according to the properties of the applied negative photoresist, and are not particularly limited.

The method for manufacturing the cliché for offset printing may comprise developing (hereinafter, referred to as a developing step) the exposed negative photoresist layer.

The developing step may be a step of forming the negative photoresist pattern layer having a protruding embossed portion and a groove pattern developed by the developer by developing the exposed negative photoresist layer. In this case, the protruding embossed portion is a portion exposed to the light in the exposing step and the portion developed by the developer is a portion which is not exposed to the light in the exposing step or is not irradiated by the light enough to have resistance by the developer.

The average line width of the groove pattern of the negative photoresist pattern layer may be 2 μm or more and 100 μm or less.

A respective line width of the groove pattern of the negative photoresist pattern layer may be 2 μm or more and 100 μm or less.

Since the groove pattern is formed by being developed by the developer because the light is shielded by the light shielding mask pattern and is not exposed to the light, the line width of the groove pattern may be determined according to the line width of the light shielding mask pattern and properties of the light of the light source. The line width of the groove pattern may be proportional to the line width of the light shielding mask pattern, and particularly, the line width of the groove pattern may be equal to or similar to the line width of the light shielding mask pattern.

The line width of at least a partial region of the groove pattern may be different from the line width of the remaining region.

The negative photoresist pattern layer may have at least two groove patterns having different line widths.

A difference in line width between at least two groove patterns may be 10 μm or more.

At least two groove patterns having a difference in line width of 10 μm or more may be connected to each other.

The shape of the groove pattern may be a pattern shape of a field requiring a metal pattern or a photoresist pattern.

The shape of the groove pattern may be a shape of the metal pattern of a touch panel, and the same pattern may be repeated or two or more different patterns may be spaced apart from or connected to each other. For example, the shape of the light shielding mask pattern may be at least one of a lattice-shaped active pattern, a router pattern connected to the active pattern and connected to an external flexible printed circuit board, and a junction pattern for lowering resistance when connecting the active pattern and the router pattern. Further, the shape of the light shielding mask pattern may further comprise a ground pattern of a circuit of the external printed circuit board.

An average depth of the groove pattern may be 3 μm or more. In this case, a bottom contact phenomenon due to the lack of groove depth and a disconnection phenomenon of the junction according to a change of the groove depth may be prevented.

Particularly, the average depth of the groove pattern may be 3 μm or more and 15 μm or less and more particularly, the average depth of the groove pattern may be 3 μm or more and 10 μm or less.

The average depth of the groove pattern may be determined by an average thickness of the negative photoresist layer. The depth of the groove pattern may be influenced by flatness and the degree of development of the negative photoresist layer, but theoretically, the average depth of the groove pattern may be the same.

Even when the groove pattern comprises two or more kinds of patterns having different line widths, the average depth of the groove pattern may be the same.

The method for manufacturing the cliché for offset printing may further comprise curing the negative photoresist pattern layer, after the developing step.

The curing condition may be adjusted according to the negative photoresist, and is not particularly limited.

The method for manufacturing the cliché for offset printing may further comprise depositing metal oxide on the substrate formed with the negative photoresist pattern layer, after the developing step.

The method of depositing the metal oxide is not particularly limited and may adopt a method which is generally used in the art.

A kind of metal oxide may be at least one of ITO, $SiO_2$ and $Al_2O_3$.

The average thickness of the deposited metal oxide may be 200 nm or less. Particularly, the average thickness of the deposited metal oxide may be 20 nm or more and 100 nm or less.

As illustrated in FIG. 1, metal or metal oxide is deposed on a substrate 1 to be manufactured by a cliché, a resist pattern 3 having various widths is formed on the metal or the metal oxide, and then an etching pattern 2 is formed by etching the metal or the metal oxide. A pattern may be formed on the cliché by etching the substrate in which the etching pattern 2 is not formed.

As illustrated in FIG. 1, in the case of using cliché s having various widths for offset printing, when the width of the groove pattern of the cliché is increased, a printing roll contacting the cliché may contact the bottom of the groove pattern of the cliché. When the printing roll contacts the bottom of the groove pattern of the cliché, the ink at the portion contacting the bottom of the groove pattern of the cliché is removed and thus a pattern different from the shape of the groove pattern of the cliché is left on the printing roll.

In order to remove the bottom contact of the printing roll, as illustrated in FIG. 2, as the line width of the groove pattern is increased, a groove pattern having a deeper depth may be formed on the cliché 10. In this case, the depth according to the line width needs to be calculated, and in order to form the calculated depth, since at least two layers of etching pattern need to be formed and the etching process needs to be performed two times or more, there is a disadvantage in that the process is complicated.

To simplify the process, as illustrated in FIG. 1, when one etching pattern is formed and the substrate is etched by the etching pattern, the pattern may be formed to be deep once on the substrate to prevent the bottom contact of the printing roll. However, in the case of increasing an etching time to increase the depth of the groove pattern, the depth of the groove pattern is increased and further, the width of the groove pattern due to overetching is increased, and thus the shape of the groove pattern formed on the cliché is different from the shape of a desired groove pattern.

The method for manufacturing the cliché according to the present invention may adjust the average depth of the groove pattern of the cliché by adjusting the average thickness of the negative photoresist pattern to solve easily the bottom contact problem according to an increase in line width of the pattern.

The present invention provides a cliché for offset printing comprising a substrate; a negative photoresist pattern layer provided on the substrate and having an embossed portion and a groove pattern; and a light shielding mask pattern provided on a bottom portion of the groove pattern.

In the cliché for offset printing, the duplicated description of with the method for manufacturing the cliché for offset printing will be omitted and the configuration of the cliché for offset printing may cite the description for the method for manufacturing the cliché for offset printing.

The material of the substrate is not particularly limited, but for example, may be a glass substrate, a thick film plastic substrate, or a thin plastic film of a thin film.

The material of the plastic substrate or the plastic film is not particularly limited, but for example, may comprise one or more of polyacrylate, polypropylene (PP), polyethylene terephthalate (PET), polyethylene ether phthalate, polyethylene phthalate, polybutylene phthalate, polyethylene naphthalate (PEN), polycarbonate (PC), polystyrene (PS), polyether imide, polyether sulfone, polydimethyl siloxane (PDMS), polyetheretherketone (PEEK), and polyimide (PI).

The substrate may use a substrate having high transparency, and the light transmittance of the substrate may be 50% or more.

An average thickness of the substrate may be 15 μm or more and 2 mm or less, but is not limited thereto.

The negative photoresist pattern layer may have an embossed portion and a groove pattern.

An average depth of the groove pattern of the negative photoresist may be 3 μm or more. In this case, regardless of the line width of the groove, a groove depth of 3 μm or more is ensured to prevent a bottom contact phenomenon due to the lack of groove depth and a disconnection phenomenon of the junction according to a change of the groove depth.

Particularly, the average depth of the groove pattern may be 3 μm or more and 15 μm or less and more particularly, the average depth of the groove pattern may be 3 μm or more and 10 μm or less.

The line width of at least a partial region of the groove pattern may be different from the line width of the remaining region. Particularly, the negative photoresist pattern layer may have at least two groove patterns having different line widths.

A difference in line width between at least two groove patterns may be 10 μm or more.

At least two groove patterns having a difference in line width of 10 μm or more may be connected to each other.

The shape of the groove pattern may be a pattern shape of a field requiring a metal pattern or a photoresist pattern.

The shape of the groove pattern may be a shape of a metal pattern of a touch panel, and the same pattern may be repeated or two or more different patterns may be spaced apart from or connected to each other. For example, the shape of the light shielding mask pattern may be at least one of a lattice-shaped active pattern, a router pattern connected to the active pattern and connected to an external flexible printed circuit board, and a junction pattern for lowering resistance when connecting the active pattern and the router pattern. Further, the shape of the light shielding mask pattern may further comprise a ground pattern of a circuit of the external printed circuit board.

The light shielding mask pattern may be provided on the bottom portion of the groove pattern of the negative photoresist pattern layer.

A metal oxide film provided on the substrate provided with the photoresist pattern layer may be further comprised.

An average thickness of the metal oxide film may be 200 nm or less. Particularly, the average thickness of the metal oxide film may be 20 nm or more and 100 nm or less.

The metal oxide film may increase a transfer characteristic of the resistance pattern in the printing process by increasing surface energy of the cliché and prevent damage to the pattern layer of the cliché according to a repeated printing process.

In this specification, the cliché is an intaglio formed with the groove pattern, and the cliché may be used for smearing ink on the intaglio to scrape the residual ink and transferring the remaining ink in the groove pattern onto a printed matter, or used for removing, from the printing plate or the printing roll, ink contacted with a protrusion of the intaglio by contacting the intaglio with the printing plate or the printing roll coated with the ink on the entire surface, forming an ink pattern corresponding to the groove pattern of the intaglio on the printing plate or the printing roll, and transferring the formed ink pattern into the printed matter.

Hereinafter, the present invention will be described in more detail with reference to Examples. However, the following Examples are just to exemplify the present invention and the present invention is not limited thereto.

Example 1

Aluminum was deposited at 120 nm on a glass substrate, and a resist pattern having a router line width of 30.2 µm, a junction line width of 3.7 µm to 29.7 µm, and an active line width of 3.2 µm was formed on the aluminum deposition layer by using a reverse offset printing process. After the aluminum without the resist pattern is removed by an aluminum etchant, the aluminum pattern as the light shielding mask pattern was formed by removing the resist pattern by a resist stripping solution as illustrated in FIG. 6. (In this case, an average line width of a router aluminum pattern: 30 µm, a line width of a junction aluminum pattern: 3.5 to 29.5 µm, an average line width of a junction aluminum pattern: 16.87 µm, and an average line width of an active aluminum pattern: 3.0 µm)

A negative photoresist layer having an average thickness of 3.5 µm was formed on the glass substrate with the aluminum pattern by using a SU-8 2005 negative photoresist.

The negative photoresist layer was post-exposure baked (PEB) for 3 minutes on a hot plate of 95° C. after bottom-exposing the surface of the glass substrate without the aluminum pattern by using a Karl Suss mask aligner.

After the negative photoresist layer was developed with an SU-8 developer for 10 minutes and then washed with isopropyl alcohol (IPA) to manufacture a cliché. In this case, in the negative photoresist pattern layer after developing, the average line width of the router groove pattern was 30 µm, the line width of the junction groove pattern was 3.5 µm to 29.5 µm (average line width: 16.87 µm), and the average line width of the active groove pattern was 3 µm.

A SiO$_2$ layer was formed on the entire surface with the negative photoresist pattern layer at a thickness of 100 nm by using a sputter.

An image obtained by photographing the manufactured cliché by a scanning electron microscope was illustrated in FIG. 7.

Example 2

A negative photoresist layer having an average thickness of 6.0 µm was formed on a glass substrate with the aluminum pattern prepared in Example 1 by using a SU-8 2005 negative photoresist.

The negative photoresist layer was post-exposure baked (PEB) for 3 minutes on a hot plate of 95° C. after bottom-exposing the surface of the glass substrate without the aluminum pattern by using a Karl Suss mask aligner.

After the negative photoresist layer was developed with an SU-8 developer for 10 minutes and then washed with isopropyl alcohol (IPA) to manufacture a cliché. In this case, in the negative photoresist pattern layer after developing, the average line width of the router groove pattern was 30 µm, the line width of the junction groove pattern was 3.5 µm to 29.5 µm (average line width: 16.87 µm), and the average line width of the active groove pattern was 3 µm.

A SiO$_2$ layer was formed on the entire surface with the negative photoresist pattern layer at a thickness of 100 nm by using a sputter.

Example 3

A negative photoresist layer having an average thickness of 7.0 µm was formed on a glass substrate with the aluminum pattern prepared in Example 1 by using a SU-8 2005 negative photoresist.

The negative photoresist layer was post-exposure baked (PEB) for 3 minutes on a hot plate of 95° C. after bottom-exposing the surface of the glass substrate without the aluminum pattern by using a Karl Suss mask aligner.

After the negative photoresist layer was developed with an SU-8 developer for 10 minutes and then washed with isopropyl alcohol (IPA) to manufacture a cliché. In this case, in the negative photoresist pattern layer after developing, the average line width of the router groove pattern was 30 µm, the line width of the junction groove pattern was 3.5 µm to 29.5 µm (average line width: 16.87 µm), and the average line width of the active groove pattern was 3 µm.

A SiO$_2$ layer was formed on the entire surface with the negative photoresist pattern layer at a thickness of 100 nm by using a sputter.

An image obtained by photographing the manufactured cliché by a scanning electron microscope was illustrated in FIG. 8.

Comparative Example

A photoresist (PR) was applied on a glass substrate deposited with a chrome thickness of 100 nm to form a chrome mask pattern through laser exposing and chrome etching processes. Molybdenum was deposited on the entire surface provided with the chrome mask pattern with a thickness of 100 nm. After the photoresist (PR) was applied on the laminate, and a molybdenum layer of a region corresponding to the router portion was selectively removed through the laser exposure and the molybdenum etching process. The exposed glass surface (corresponding to the router portion) of the laminate was etched to a depth of 5 µm by using a hydrofluoric acid etchant. The molybdenum layer on the upper surface of the laminate was removed by using a molybdenum etchant, and then the exposed glass surface was further etched to a depth of 250 nm by using the hydrofluoric acid etchant. The chrome layer on the upper surface of the laminate was removed by a chrome etchant to complete a double-etched cliché. In the double-etched cliché manufactured through the process, the active line width was 3 µm, the active groove depth was 250 nm, the router line width was 30 µm, and the router portion groove depth was 5.25 µm.

A process diagram of manufacturing the cliché in Comparative Example was illustrated in FIG. 9.

An image obtained by photographing the manufactured cliché by a scanning electron microscope was illustrated in FIG. 10.

Experimental Example 1

Durability Experiment of Stripping Solution

The cliché manufactured in Examples 1 to 3 and Comparative Example was immersed in a resist stripping solution (LG Chem product, product name: LGS-202) for 24 hours, and a change in groove depth and whether or not the pattern was removed were observed and the results are illustrated in Table 1 below.

In this case, when the groove depth was decreased or the removal of the pattern was observed, it was determined as X and when a change was not observed, it was determined as O.

Experimental Example 2

Experiment on Printing Pressure Margin

A blanket roll coated with a resist ink with a thickness of 3 μm was rotated and contacted with the cliché manufactured in Examples 1 to 3 and Comparative Example. After an unnecessary resist pattern was transferred from the blanket roll to the top of the cliché, the blanket roll provided with the resist pattern was rotatably in contact with the printed substrate to transfer the resist pattern onto the printed substrate.

Table 1 below illustrates a printing pressure margins in which the pattern is normally implemented when the blanket roll and the cliché are in contact with each other.

In this case, the printing pressure means pressure pressed in a Z axis when the blanket roll contacts the cliché. An actual value indicating the printing pressure is not indicated by the pressure, and a contact point where the blanket and the cliché are in contact with each other by the pressure that presses the Z axis capable of representing the pressure is expressed as a moving distance d in the Z axis.

The printing pressure margin means a maximum value of the moving distance d in the Z axis where the corresponding pattern may be printed without bottom contact.

TABLE 1

| | Router printing pressure margin (μm) | Junction printing pressure margin (μm) | Active printing pressure margin (μm) | print printing pressure margin (μm) | Durability of resist stripping solution |
|---|---|---|---|---|---|
| Example 1 | 100 | >400 | >400 | 100 | O |
| Example 2 | 150 | >400 | >400 | 150 | O |
| Example 3 | 300 | >400 | >400 | 300 | O |
| Comparative Example | 150 | 50 | 100 | 50 | O |

Under the condition of the printing pressure of 100 μm, the resist pattern printed on the printed substrate by using the blanket roll and the cliché manufactured in Example 1 and Comparative Example is illustrated in FIG. 13.

As illustrated in FIG. 13, it can be seen that the active pattern and the junction pattern are printed seamlessly by the cliché in Example 1. Meanwhile, it can be seen that by the cliché in Comparative Example, the blanket roll was in contact with the bottom of the groove pattern of the cliché to remove the resist which should not be removed, and the active pattern and the junction pattern printed on the printed substrate are disconnected.

The invention claimed is:

1. A method for manufacturing a cliché for offset printing comprising the steps of:
   forming a light shielding mask pattern on a substrate;
   forming a negative photoresist layer on the substrate provided with the light shielding mask pattern;
   exposing the negative photoresist layer by irradiating light to the substrate side;
   forming a negative photoresist pattern layer having a protruding embossed portion and a developed groove pattern by developing the exposed negative photoresist layer; and
   depositing ITO, $SiO_2$ or $Al_2O_3$ with a thickness of 20 nm to 100 nm on the substrate formed with the negative photoresist pattern layer, after the developing step,
   wherein the light shielding mask pattern is a metal pattern which is made of aluminum (Al),
   wherein the light shielding mask pattern comprises an active pattern, a router pattern and a junction pattern, and a line width of the junction pattern is increased from the active attern to the router pattern,
   wherein an average thickness of the negative photoresist layer is 3 μm or more,
   the negative photoresist pattern layer has at least two groove patterns having different line widths, a difference in line width between at least two groove patterns is 10 μm or more, and
   at least two groove patterns having a difference in line width of 10 μm or more are connected to each other.

2. A cliché for offset printing, comprising:
   a substrate;
   a negative photoresist pattern layer provided on the substrate and having an embossed portion and a groove pattern;
   a metal oxide film on the substrate provided with the photoresist pattern layer, wherein the metal oxide film is ITO, $SiO_2$ or $Al_2O_3$; and
   a light shielding mask pattern provided on a bottom portion of the groove pattern,
   wherein the light shielding mask pattern is a metal pattern which is made of aluminum (Al),
   wherein the light shielding mask pattern comprises an active pattern, a router pattern and a junction pattern, and a line width of the junction pattern is increased from the active attern to the router pattern,
   wherein an average thickness of the metal oxide film is from 20 nm to 100 nm, and
   wherein an average depth of the groove pattern of the negative photoresist is 3 μm or more,
   the negative photoresist pattern layer comprises at least two groove patterns having different line widths, an average depth of the groove pattern of the negative photoresist pattern layer is the same,
   a difference in line width between at least two groove patterns is 10 μm or more, and at least two groove patterns having a difference in line width of 10 μm or more are connected to each other.

* * * * *

UNITED STATES PATENT AND TRADEMARK OFFICE
CERTIFICATE OF CORRECTION

PATENT NO. : 10,696,081 B2
APPLICATION NO. : 15/536046
DATED : June 30, 2020
INVENTOR(S) : Yong Goo Son et al.

It is certified that error appears in the above-identified patent and that said Letters Patent is hereby corrected as shown below:

In the Claims

At Column 12, Lines 23, to Column 12, Line 31, please replace Claim 1 with the following claim:
1. A method for manufacturing a cliché for offset printing comprising the steps of:
    forming a light shielding mask pattern on a substrate;
    forming a negative photoresist layer on the substrate provided with the light shielding mask pattern;
    exposing the negative photoresist layer by irradiating light to the substrate side;
    forming a negative photoresist pattern layer having a protruding embossed portion and a developed groove pattern by developing the exposed negative photoresist layer; and
depositing ITO, $SiO_2$ or $Al_2O_3$ with a thickness of 20 nm to 100 nm on the substrate formed with the negative photoresist pattern layer, after the developing step,
    wherein the light shielding mask pattern is a metal pattern which is made of aluminum (Al),
    wherein the light shielding mask pattern comprises an active pattern, a router pattern and a junction pattern, and a line width of the junction pattern is increased from the active pattern to the router pattern,
    wherein an average thickness of the negative photoresist layer is 3 μm or more,
    the negative photoresist pattern layer has at least two groove patterns having different line widths, a difference in line width between at least two groove patterns is 10 μm or more, and
    at least two groove patterns having a difference in line width of 10 μm or more are connected to each other.

At Column 12, Lines 32, to Column 12, Line 59, please replace Claim 2 with the following claim:
2. A cliché for offset printing, comprising:
    a substrate;
    a negative photoresist pattern layer provided on the substrate and having an embossed portion and a groove pattern;
a metal oxide film on the substrate provided with the photoresist pattern layer, wherein the metal Signed and Sealed this
Seventeenth Day of November, 2020

Andrei Iancu
*Director of the United States Patent and Trademark Office* oxide film is ITO, $SiO_2$ or $Al_2O_3$; and a light shielding mask pattern provided on a bottom portion of the groove pattern, wherein the light shielding mask pattern is a metal pattern which is made of aluminum (Al), wherein the light shielding mask pattern comprises an active pattern, a router pattern and a junction pattern, and a line width of the junction pattern is increased from the active pattern to the router pattern, wherein an average thickness of the metal oxide film is from 20 nm to 100 nm, and wherein an average depth of the groove pattern of the negative photoresist is 3 μm or more, the negative photoresist pattern layer comprises at least two groove patterns having different line widths, an average depth of the groove pattern of the negative photoresist pattern layer is the same, a difference in line width between at least two groove patterns is 10 μm or more, and at least two groove patterns having a difference in line width of 10 μm or more are connected to each other.